United States Patent
Park et al.

(10) Patent No.: US 11,285,591 B2
(45) Date of Patent: Mar. 29, 2022

(54) TORQUE-LIMITED INSTALLATION AND REMOVAL DEVICE

(71) Applicant: Arista Networks, Inc., Santa Clara, CA (US)

(72) Inventors: Youngbae Park, Milpitas, CA (US); Robert Wilcox, Saratoga, CA (US); Richard Hibbs, Santa Clara, CA (US); Daehwan Daniel Kim, Sunnyvale, CA (US); Adam Hemp, Belmont, CA (US); Bruce Wang, Santa Clara, CA (US)

(73) Assignee: Arista Networks, Inc., Santa Clara, CA (US)

( * ) Notice: Subject to any disclaimer, the term of this patent is extended or adjusted under 35 U.S.C. 154(b) by 50 days.

(21) Appl. No.: 16/919,977

(22) Filed: Jul. 2, 2020

(65) Prior Publication Data

US 2022/0001519 A1 Jan. 6, 2022

(51) Int. Cl.
| | |
|---|---|
| B25B 23/00 | (2006.01) |
| B25B 23/142 | (2006.01) |
| H05K 5/02 | (2006.01) |
| G06F 1/16 | (2006.01) |
| B25B 23/14 | (2006.01) |

(52) U.S. Cl.
CPC ........ *B25B 23/1427* (2013.01); *B25B 23/141* (2013.01); *G06F 1/16* (2013.01); *H05K 5/0217* (2013.01)

(58) Field of Classification Search
None
See application file for complete search history.

(56) References Cited

U.S. PATENT DOCUMENTS

| 4,813,298 A * | 3/1989 | Kurtossy | F16H 37/06 |
| | | | 475/330 |
| 6,850,415 B2 * | 2/2005 | Dimarco | H05K 7/1451 |
| | | | 361/752 |
| 7,406,900 B1 * | 8/2008 | Hsieh | B25B 23/1427 |
| | | | 81/475 |

(Continued)

OTHER PUBLICATIONS

International Patent Application No. PCT/US2021/040383 mailed Oct. 19, 2021; 10 pages.

*Primary Examiner* — Anthony Q Edwards
*Assistant Examiner* — Rashen E Morrison
(74) *Attorney, Agent, or Firm* — Fountainhead Law Group P.C.

(57) ABSTRACT

In one embodiment a device for tightening and loosening a securing device is provided. The device includes a housing, a shaft, and a clutch assembly. In one embodiment, the clutch assembly includes a clutch activation member, a first friction member coupled to the clutch activation member, and a second friction member coupled to the shaft. When the clutch activation member is in a first position, the clutch activation member engages the first friction member with the second friction member for transmission of torque from the first friction member to the second friction member. When the clutch activation member is in the second position, the clutch activation member disengages the first friction member from the second friction member to prevent transmission of the torque from the first friction member to the second friction member.

19 Claims, 14 Drawing Sheets

(56) References Cited

U.S. PATENT DOCUMENTS

| | | | | |
|---|---|---|---|---|
| 7,420,820 | B1* | 9/2008 | Lima | H05K 7/1407 |
| | | | | 312/223.2 |
| 8,289,707 | B2* | 10/2012 | Liao | H04Q 1/023 |
| | | | | 361/679.58 |
| 9,731,407 | B1* | 8/2017 | Edmisten | B25B 13/481 |
| 9,781,858 | B2* | 10/2017 | Fricker | H05K 7/18 |
| 10,701,464 | B2* | 6/2020 | Wilcox | H04Q 1/02 |
| 2005/0204876 | A1* | 9/2005 | Chen | B25B 15/02 |
| | | | | 81/473 |
| 2009/0153002 | A1* | 6/2009 | Kinoshita | B60R 11/0258 |
| | | | | 312/223.1 |
| 2011/0094354 | A1* | 4/2011 | Lai | B25B 23/1427 |
| | | | | 81/475 |
| 2016/0128230 | A1* | 5/2016 | Lam | H05K 7/20727 |
| | | | | 361/695 |
| 2019/0344369 | A1* | 11/2019 | Lin | B25B 23/1427 |

* cited by examiner

TORQUE-LIMITED INSTALLATION AND REMOVAL DEVICE

BACKGROUND

Many modern computer systems such as servers, switches, routers, etc. are modular. These systems may include a chassis with a plurality of slots that may each receive an electronic module. In some cases, electronic modules may themselves host smaller electronic modules. In these cases, the host module may have an array of electronic connectors that the electronic module is adapted to mate with. The host module may include mechanical guides that ensure successful mating between the electronic module and the host module.

Oftentimes, the installation force required to properly seat the electronic module in the host module is considerable. Yet, damage to the connectors on either or both of the host module and the electronic module can arise if too much force is applied to the electronic module during installation.

BRIEF DESCRIPTION OF THE DRAWINGS

With respect to the discussion to follow and in particular to the drawings, it is stressed that the particulars shown represent examples for purposes of illustrative discussion and are presented in the cause of providing a description of principles and conceptual aspects of the present disclosure. In this regard, no attempt is made to show implementation details beyond what is needed for a fundamental understanding of the present disclosure. The discussion to follow, in conjunction with the drawings, makes apparent to those of skill in the art how embodiments in accordance with the present disclosure may be practiced. Similar or same reference numbers may be used to identify or otherwise refer to similar or same elements in the various drawings and supporting descriptions. In the accompanying drawings.

DETAILED DESCRIPTION

Figure 1:
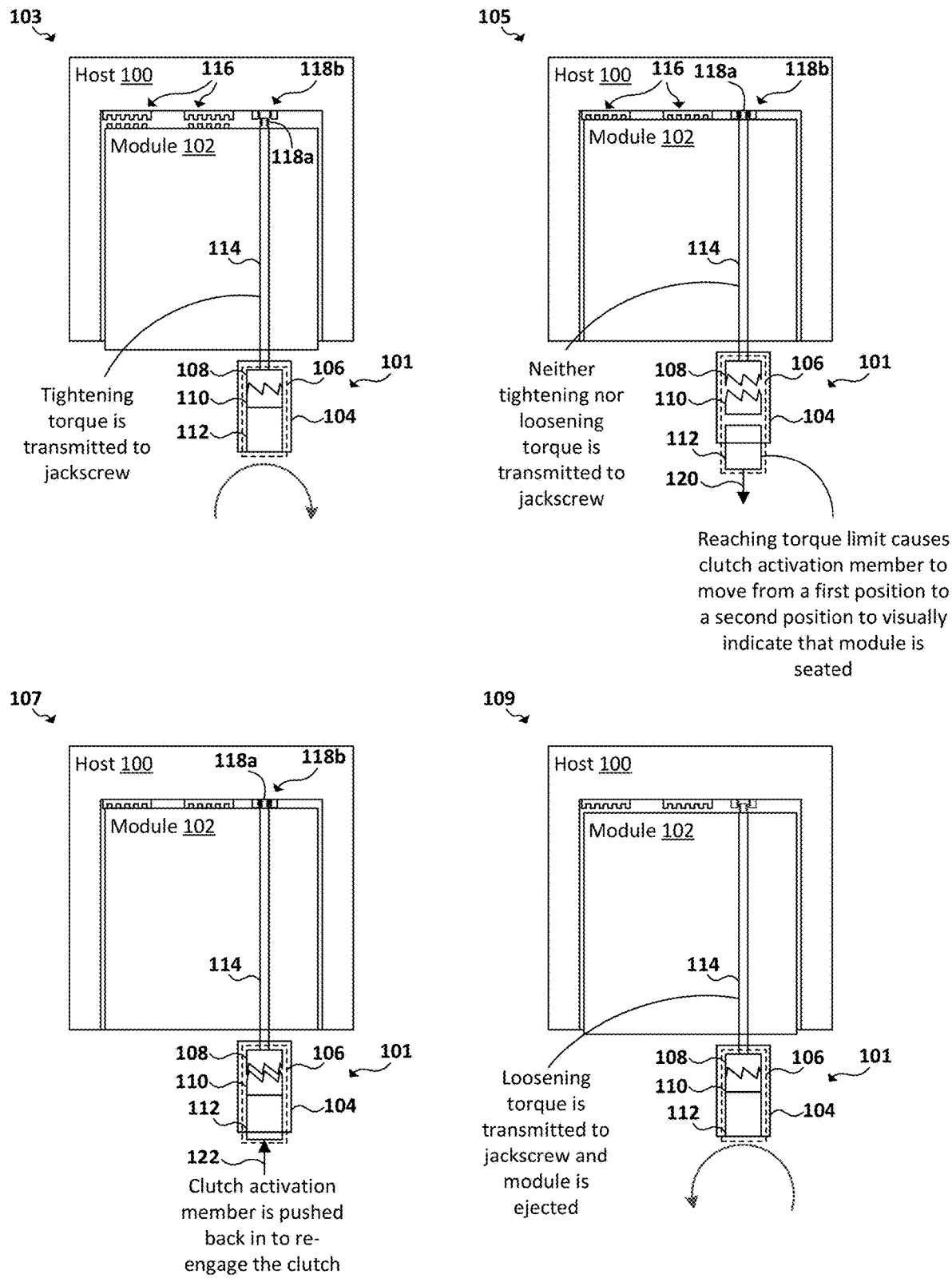
FIG. 1 depicts a schematic diagram of the overall operation of an installation and removal device according to some embodiments.

Electronic modules and their corresponding host modules may be equipped with jackscrews to facilitate installation and removal of the electronic modules. A jackscrew is operated by turning a leadscrew (male end) into and out of a corresponding screw receiver (female end). The turning motion of the leadscrew is translated into linear motion of the leadscrew relative to the screw receiver. As a result, components affixed to the lead screw and those affixed to the screw receiver are brought closer together or farther apart. A clockwise (e.g., tightening) rotation of the leadscrew, for example, can bring the leadscrew and the screw receiver closer together, while a counter-clockwise rotation moves them farther apart. In circumstances where the leadscrew and screw receiver are reverse-threaded, the clockwise and counter-clockwise operations would be swapped.

Electronic modules may be equipped with a leadscrew positioned at the backend of the module (e.g., an end that is inserted into a slot opening first). A host module may include a screw receiver toward the back of the slot and aligned with the leadscrew when the electronic module is properly aligned with the slot opening. The leadscrew may be coupled to one end of a shaft, the other end of the shaft extending from the backend to a faceplate of the electronic module. The shaft may have a driver interface (e.g., Phillips, hex, Torx, square, knob) that is accessible through the faceplate.

To install the electronic module into the host module, an installer may first insert (e.g., slide) the electronic module into the host module to a depth where the leadscrew and the screw receiver make contact. The installer completes installation by turning the driver interface using a handheld tool. The turning motion of the driver interface consequently turns the leadscrew, which "pulls" the electronic module into a seated position. At some point, an increased resistance to further turning notifies the installer that the jackscrew has been sufficiently torqued and that the electronic module is seated. To eject and remove the electronic module, the installer turns the driver interface in the opposite direction, which causes the jackscrew to "push" the electronic module out from the slot.

A jackscrew can provide high insertion force with minimum space. One challenge that can arise during installation is overtightening of the jackscrew. With the use of handheld tools, installers may be prone to overtightening the leadscrew into the screw receiver. This may result in damage to the threads of the screw receiver and/or the leadscrew as well as to connector components. However, if too much torque is applied to tighten the module during installation, the jackscrew can bind and become hard to loosen. Overtightening on the jackscrew can lead to difficulties when attempting to eject and remove the electronic module. Another challenge is being able to efficiently determine electronic modules have been properly installed and seated into their respective host modules. For example, it can be cumbersome and time-consuming for a technician in a data center to have to torque-test every electronic module for proper installation, especially considering that a data center can have many hundreds to thousands of installed modules.

The present disclosure address these challenges by providing an installation and removal device with a built-in torque limiter. As will be described in detail below, the torque limiter limits the magnitude of torque that can be transmitted by the device to the jackscrew to a predefined torque threshold. These embodiments further provide for a visual indicator mechanism that is automatically activated when the device reaches the predefined torque threshold. The visual indicator provides an easily identifiable indication that the jackscrew has been properly torqued. In some embodiments, each electronic module can be equipped with its own installation and removal device. In these embodiments, the installation and removal device may be fixed to the shaft in the electronic module and extend outward from its faceplate. After installation, a technician may be able to quickly determine whether an electronic module in an array of electronic modules is properly installed or not.

FIG. 1 depicts a schematic diagram of operation of an installation and removal device 101 in stages 103, 105, 107, 109, according to some embodiments. Installation and removal device 101 is shown to include housing 104 which can serve as a handle that a technician can grasp to operate the device. Housing 104 is also shown to house clutch assembly 106. The clutch assembly serves to: (1) transmit a torque generated by turning housing 104 to shaft 114 when the torque is below a predefined threshold; and (2) to prevent torque above the predefined threshold from being transmitted to shaft 114.

As shown in FIG. 1, clutch assembly 106 includes first friction member 110 coupled to clutch activation member 112, and second friction member 108 coupled to shaft 114. In the embodiment shown, clutch activation member 112 can regulate the operation of the clutch assembly 106 depending upon the magnitude of torque applied to housing 104. For example, when the applied torque is below the predefined threshold, clutch activation member 112 engages first friction member 110 with second friction member 108, thereby allowing clutch assembly 106 to transmit torque to shaft 114. In various embodiments, this can be referred to as an engaged state of clutch assembly 106. When the applied torque surpasses the predefined threshold, clutch activation member 112 disengages first friction member 110 from second friction member 108, thereby disallowing clutch assembly 106 from transmitting torque to shaft 114. In various embodiments, this can be referred to as a disengaged state of clutch assembly 106.

At stage 103, module 102 is shown to be partially inserted into host 100. Module 102 and host 100 are shown to include corresponding connector components 116 that are to be mated when the module 102 is fully seated in host 100. Module 102 is shown to include leadscrew 118a which is affixed to the module and protrudes from a backend of the module. Host 100 is shown to include screw receiver 118b that leadscrew 118a is configured to thread into. At stage 103, clutch activation member 112 is shown to be in a first position for maintaining clutch assembly 106 in the engaged state. For example, when clutch activation member 112 is in the first position, it applies pressure against first friction member 110. In doing so, first friction member 110 engages with second friction member 108. As a result, tightening torque applied to housing 104 can be transmitted to leadscrew 118a to cause threads of leadscrew 118a to begin interlocking with corresponding threads of screw receiver 118b. As leadscrew 118a is tightened into screw receiver 118b, leadscrew 118a pulls module 102 into host 100 by virtue of being affixed to the module.

As shown in FIG. 1, at stage 105, module 102 is fully seated inside host 100. For example, connector components 116 of the host 100 and module 102 are successfully mated. Additionally, leadscrew 118a has "bottomed out" in screw receiver 118b. In various embodiments, the bottoming out may be caused by threads of the leadscrew 118a reaching an end of their travel, or by a flange of the leadscrew 118a pressing against a corresponding surface of the screw receiver 118b. In either case, these events may provide relatively substantial and sudden resistance to further tightening.

In the embodiment shown, as the bottoming out event of leadscrew 118a occurs, the continued application of torque to housing 104 increases the torque on housing 104, eventually leading to the torque surpassing the predefined threshold. As the applied torque surpasses the predefined threshold, clutch activation member 112 slides 120 from the first position to the second position. As clutch activation member 112 slides 120 from the first position to the second position, clutch activation member 112 also captures the first friction member 110 and disengages first friction member 110 from second friction member 108. This aspect of the present disclosure is discussed in more detail below. Clutch assembly 106 is thereby placed in the disengaged state. In this state, clutch assembly 106 prevents any torque from being transmitted to leadscrew 118a. Moreover, and in some embodiments, clutch assembly 106 also prevents loosening torque from being transmitted to leadscrew 118a when it is in the disengaged state.

In the embodiment shown, once clutch activation member 112 slides 120 into the second position, a portion of the clutch activation member protrudes from housing 104. The protruding portion of clutch activation member 112 can serve as a visual indicator to a technician that leadscrew 118a is properly torqued and that module 102 is properly seated.

As shown in FIG. 1, at stage 107, module 102 is being prepared for ejection and removal. To eject module 102, clutch activation member 112 is pushed 122 from the second position to the first position. In the embodiment shown, pushing 122 clutch activation member 112 back into the first position re-engages first friction member 110 with second friction member 108. At stage 109, clutch activation member 112 is positioned again in the first position such that first friction member 110 is engaged with second friction member 108. Loosening torque may then be transmitted, via clutch assembly 106, to jackscrew 118a. Consequently, module 102 is ejected from host 100.

Figure 2:
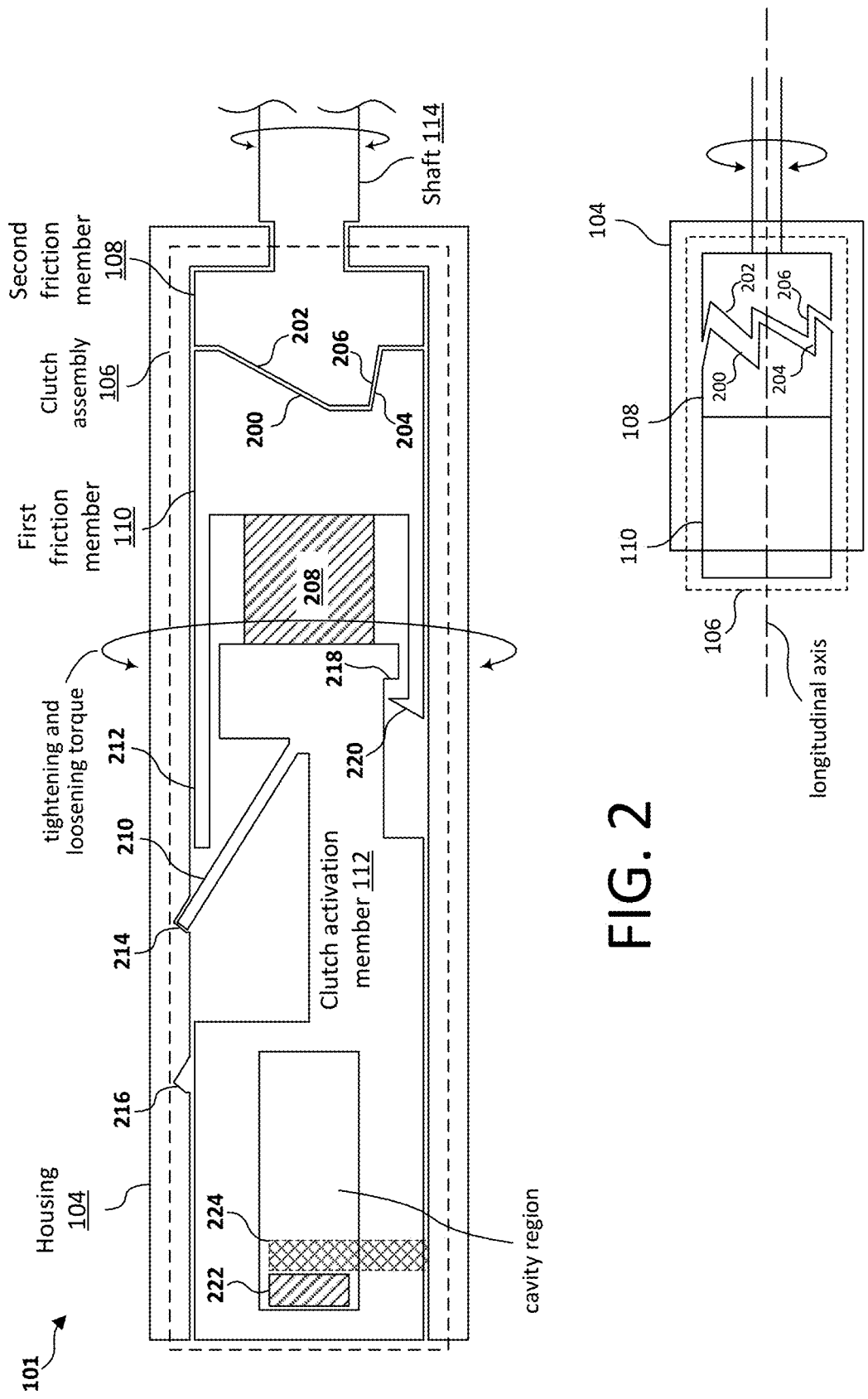
FIGS. 2-7 illustrate cross-sectional views of the installation and removal device according to various embodiments.
Figure 9:
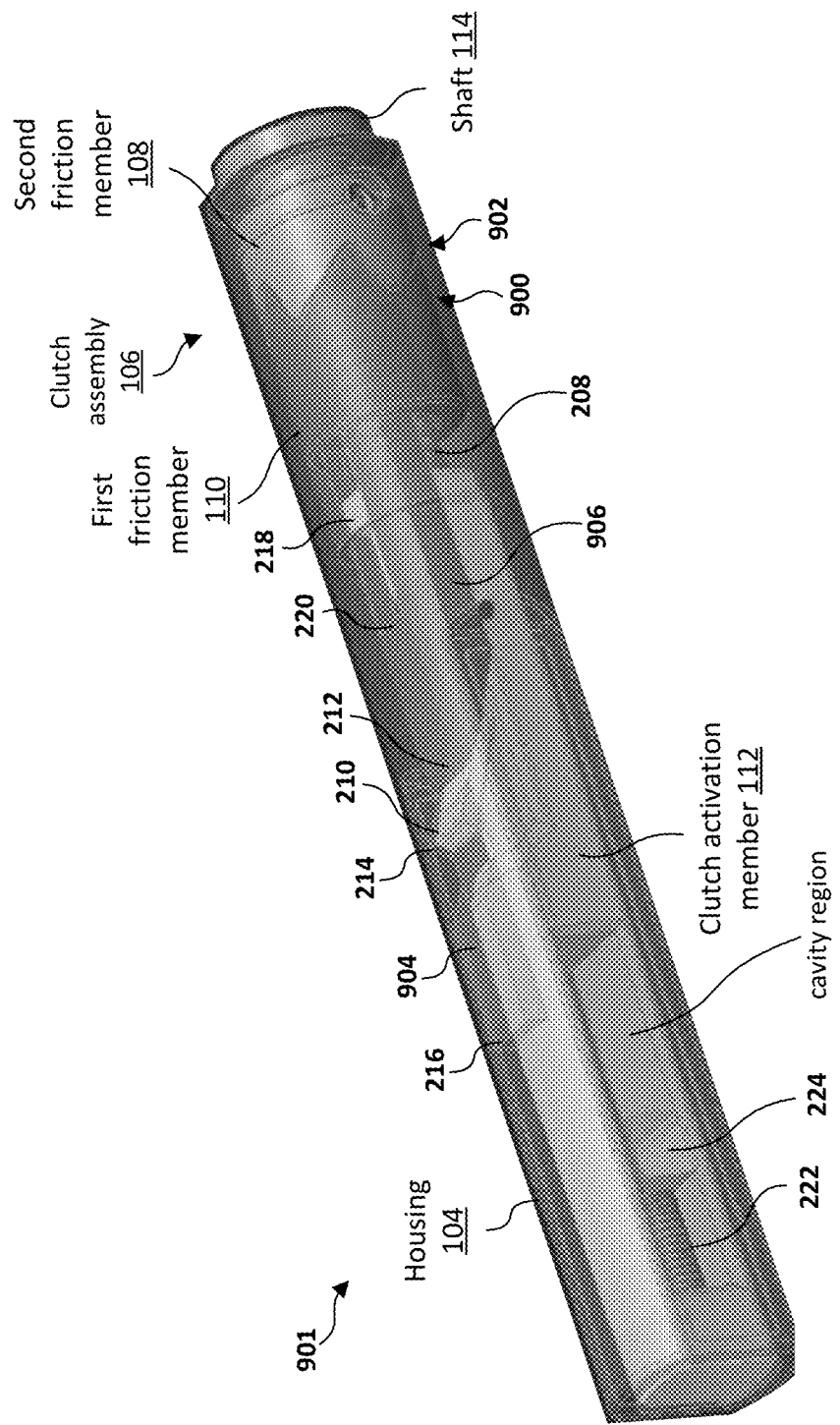
FIG. 9 illustrates a 3-dimensional computer-aided design drawing of an installation and removal device according to some embodiments.

FIGS. 2-7 show cross-sectional views of installation and removal device 101 at various stages of operation, according to some embodiments. FIG. 2 shows installation and removal device 101 with clutch activation member 112 in the first lateral position ("first position") and clutch assembly 106 in the engaged state. According to the embodiment shown, clutch activation member 112 is retained in the first position by virtue of latch 210 being engaged in slot 214. When in the first position, clutch activation member 112 compresses spring 208 so as to apply a pressing force against first friction member 110. The pressing force causes first friction member 110 to engage with second friction member 108. In some embodiments, for example, first friction member 110 and second friction member 108, each, may be configured as annularly arranged ramps. The pressing force acts to interlock the set of annularly arranged ramps of first friction member 110 with the complementary set of annularly arranged ramps of second friction member 108. In FIG. 2, ramps 200 and 204 of first friction member 110 are shown to interlock with complementary ramps 202 and 206 of second friction member 108. FIG. 2A provides a top view of this interlocking arrangement of ramps and FIG. 9 provides a perspective view of the interlocking arrangement of ramps.

As installation and removal device 101 is turned by a user, the resulting torque is transferred from housing 104 to first friction member 110 because first friction member 110 is slidably and rotationally fixed with respect to housing 104. Thus, a tightening torque applied at housing 104 transfers to ramp 200 via first friction member 110 to push ramp 200 against ramp 202. Loosening torque received at housing 104 is transferred to ramp 204 to push against ramp 206.

In various embodiments, as a tightening torque is applied by a user, ramp 200 will push against ramp 202. Because ramps 200 and 202 are sloped, ramp 200 will tend to slide relative to ramp 202. The tendency of ramp 200 to slide along ramp 202 is counteracted by the static friction between ramps 200 and 202. The amount of static friction between ramps 200 and 202 depends on factors such as coefficients of friction of the surfaces of ramps 200 and 202, the slope angles of ramps 200 and 202, the contact area between ramps 200 and 202, the pressing force of spring 208, and so on. When the tightening torque is below a torque threshold, the static friction between ramps 200 and 202 is sufficient to prevent ramps 200 and 202 from sliding across each other. As a result, first friction member 110 and second friction member 108 will rotate in unison so that the tightening torque is transferred to shaft 114.

As the tightening torque continues to increase and surpasses the torque threshold, the static friction between ramps 200 and 202 will no longer be sufficient to overcome the sliding tendency between the ramps. As a result, ramp 200 slides relative to ramp 202 and clutch assembly 106 begins to disengage as first friction member 110 begins to slide laterally relative to second friction member 108.

The torque threshold can therefore be determined based on the foregoing static friction factors. For example, during design of installation and removal device 101, the torque threshold can be adjusted by:

increasing or decreasing the spring constant of spring 208;
increasing or decreasing the amount of compression of spring 208 when clutch activation member 112 is in the first position;
increasing or lowering the number of interlocking ramps of first friction member 110 and second friction member 108;
increasing or decreasing the slopes of ramps 200 and 202 relative to a longitudinal axis of installation and removal device 101;
using a material with a higher or lower coefficients of friction; and
changing other mechanical parameters.

Continuing with FIG. 2, ramp 204 can be configured to transfer loosening torque to ramp 206 when removing the electronic module. Ramps 204 and 206 are shown to be less sloped (have a smaller angle) relative to a longitudinal axis of installation and removal device 101 as compared to ramps 200 and 202; see for example FIG. 2A. As a result, when ramp 204 pushes against ramp 206, there is negligible sliding if any between ramps 204 and 206. Advantageously, this feature of first friction member 110 and second friction member 108 limits tightening torque without limiting loosening torque. This asymmetrical torque-limiting aspect of installation and removal device 110 is beneficial because tightening torque can be limited to prevent overtightening of the electronic module during insertion, whereas no such limit is needed when removing the electronic module.

Figure 3:
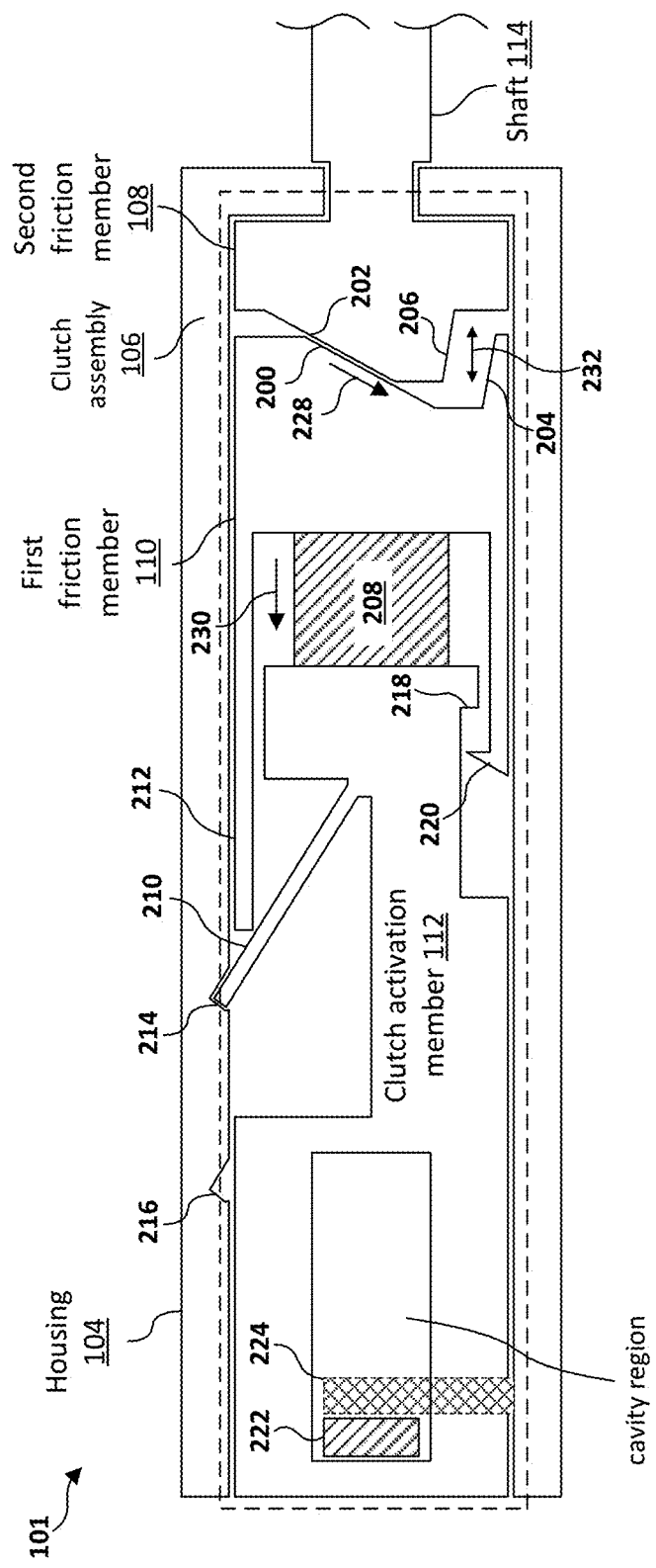

FIG. 3 shows installation and removal device 101 in a state where the tightening torque has reached or is close to reaching the torque threshold, according to one embodiment. In this state, as the user continues to turn the device during installation, the generated torque results in ramp 200 sliding across ramp 202. The relative sliding between ramps 200 and 202 causes a lateral displacement 232 of first friction member 110 from second friction member 108. At this stage, clutch assembly 106 still transmits a tightening torque to shaft 114. However, the amount of torque is reduced because some of the turning force applied by the user is used to overcome the static friction (e.g., friction between ramp surfaces, compress spring 208) between ramps 200 and 202 as ramp 200 starts sliding across ramp 202. In various embodiments, this stage of the clutch assembly 106 may be referred to as a partially disengaged state; the clutch assembly is not fully engaged so as to transmit tightening torque fully to shaft 114, nor fully disengaged so as to decouple tightening torque from shaft 114.

Also shown in FIG. 3, lateral displacement 232 of first friction member 110 further and causes latch release member 212 of first friction member 110 to move toward latch 210. At this stage, latch 210 remains engaged in slot 214 and therefore clutch activation member 112 remains in the first position.

Figure 4:
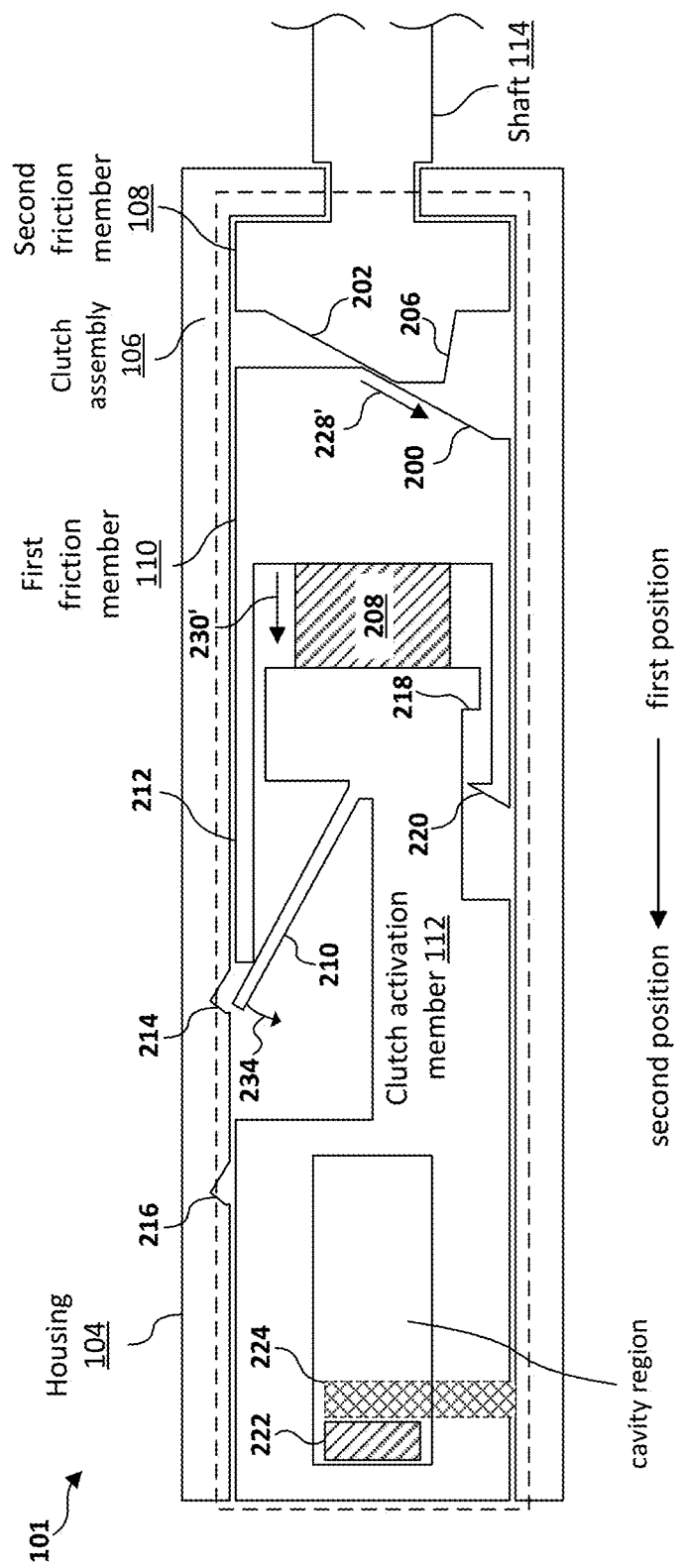

FIG. 4 shows installation and removal device 101 in a state where first friction member 110 causes clutch activation member 112 to begin shifting from the first position to the second lateral position ("second position"). For example, further sliding 228' of ramp 200 along ramp 202 results in lateral displacement 230 of first friction member 110. Further lateral displacement 230 of first friction member 110 can cause latch release member 212 to push against 234 latch 210 and thereby release latch 210 from slot 214. When latch 210 has cleared slot 214, a left-to-right force exerted by spring 208 can move clutch activation member 112 in a direction from the first position to the second position.

In some embodiments such as the one shown in FIG. 4, secondary spring 222 disposed in a cavity region of clutch activation member 112 can assist in moving clutch activation member 112 from the first position to the second position. For example, when clutch activation member 112 is in the first position, secondary spring 222 is compressed between stop 224 (attached to housing 104) and an interior surface of the cavity region in clutch activation member 112. Once latch 210 is released from slot 214, secondary spring 222 exerts a lateral force in addition to the force exerted by spring 208.

Figure 5:
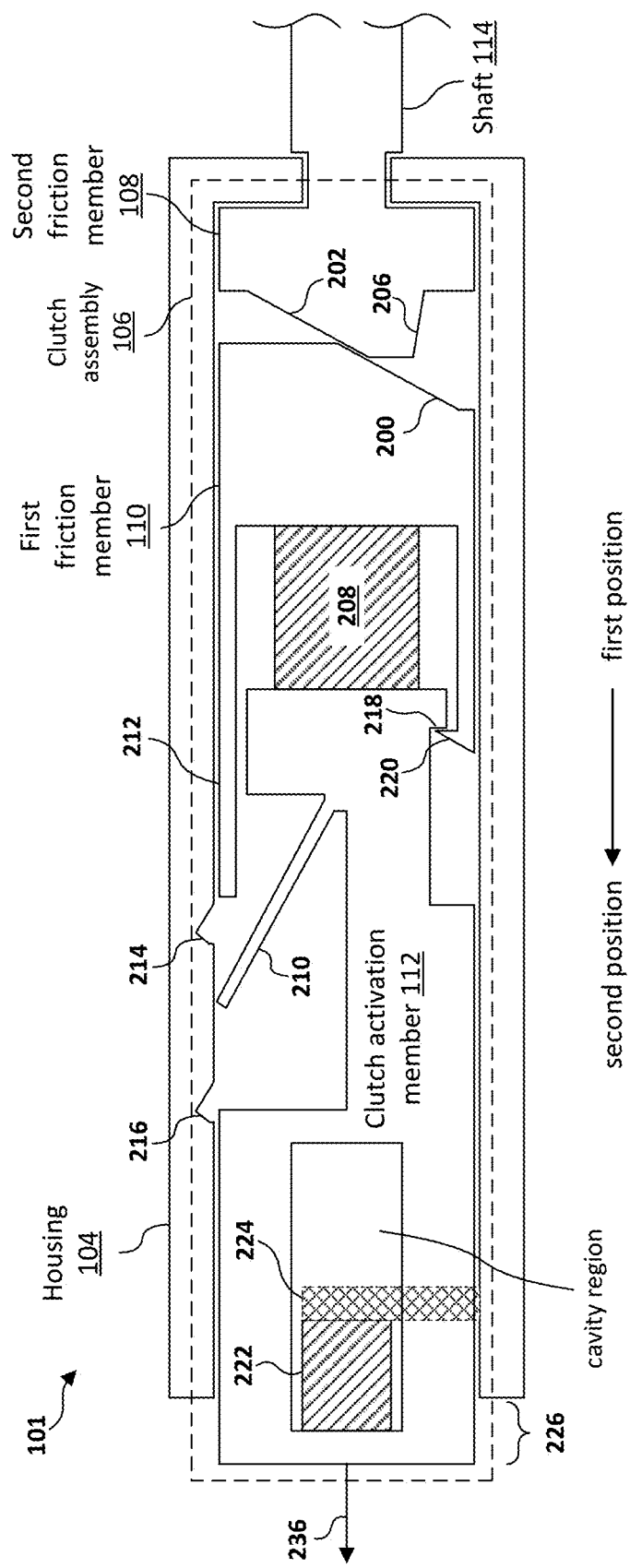

FIG. 5 shows installation and removal device 101 in a state where clutch activation member 112 is in the process of laterally moving 236 from the first position to the second position. As clutch activation member 112 moves 236, a portion 226 of clutch activation member 112 begins to protrude from housing 104. Once protruded from housing 104, portion 226 of clutch activation member 112 can serve as a visual indicator that the torque threshold has been reached. This can help users easily discern which modules have been properly seated and which have not.

Also shown in the embodiment of FIG. 5 is catch member 220 formed on first friction member 110 contacting a corresponding shoulder 218 of clutch activation member. As clutch activation member 112 moves 236 toward the second position, shoulder 218 pulls against catch member 220 which pulls first friction member 110 to completely separate and disengage first friction member 110 from second friction member 108.

Figure 6:
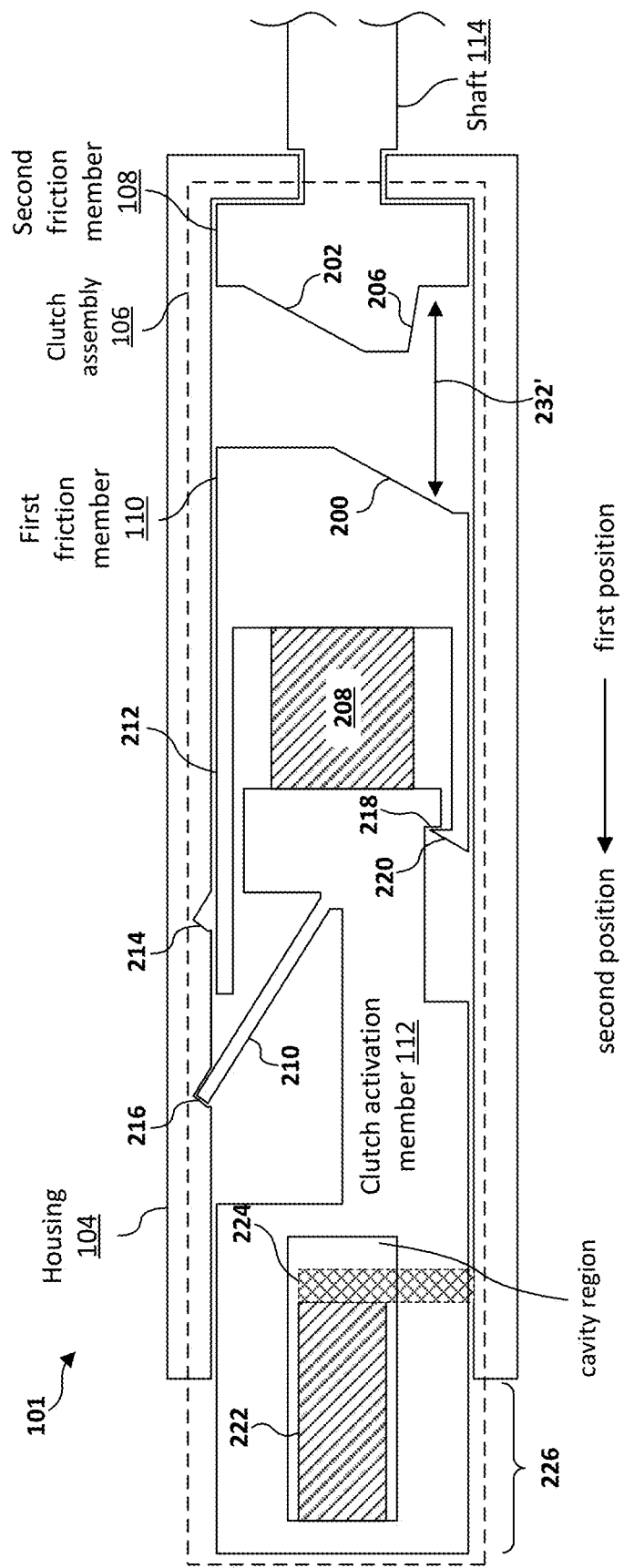

FIG. 6 shows clutch activation member 112 in the second position. As clutch activation member 112 travels laterally outward from housing 104, latch 210 engages slot 216 formed in housing 104, which terminates further lateral motion of clutch activation member 112. At this stage, clutch assembly 106 can be deemed to be in the disengaged state with lateral displacement 232' at a maximum. As can be seen in the figure, further turning action on housing 104 (clockwise or counterclockwise) will not transmit any tightening or loosening torque to shaft 114; housing freely rotates about shaft 114. Portion 226 of clutch activation member 112 is also fully protruded from housing 104 and can serve to visually indicate that the torque threshold has been reached.

Figure 7:
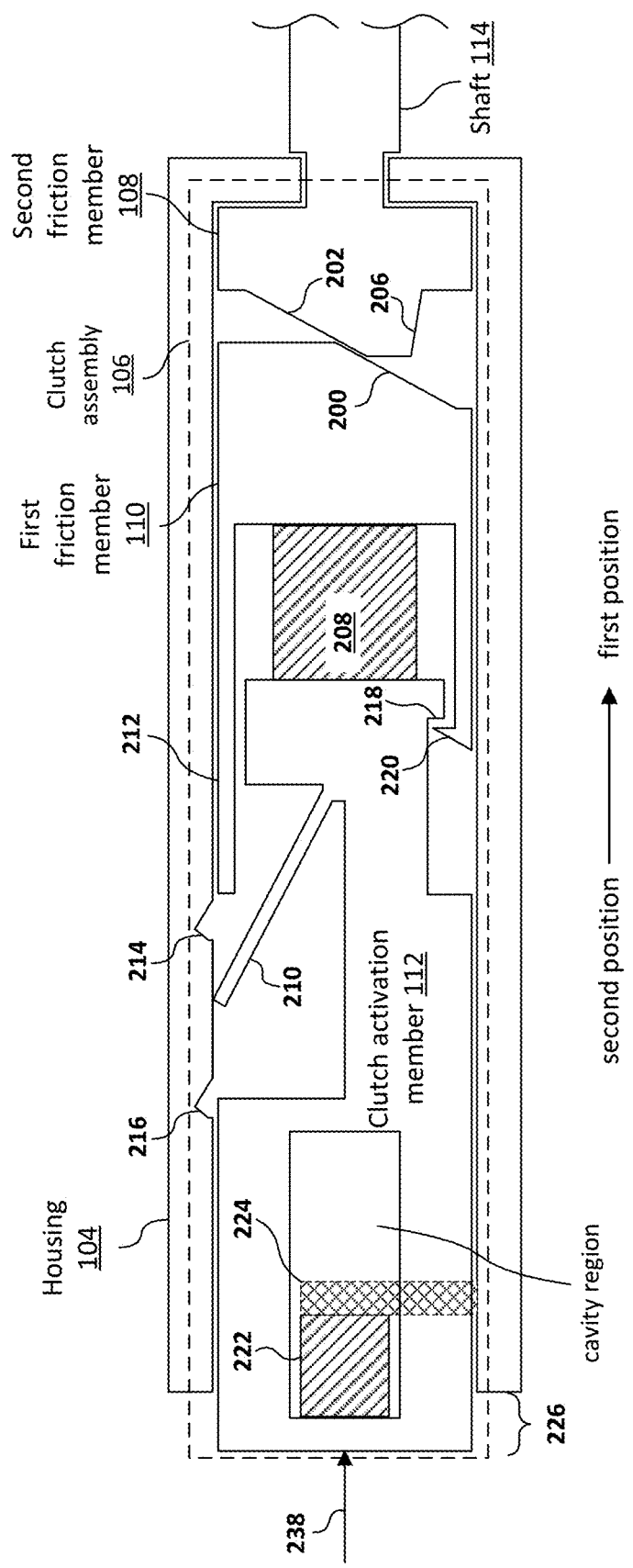

FIG. 7 shows clutch activation member 112 being pushed 238 from the second position back into the first position. At this stage, pushing 238 causes first friction member 110 to re-engage with second friction member 108. For example, ramp 200 comes back into contact with ramp 202. As pushing 238 continues, clutch activation member 112 is placed back into the first position and remains in position when latch 210 re-engages slot 214. In this state, spring 208 exerts a pressing force against first friction member 110 to fully engage it with second friction member 108 such that ramps 200 and 204 and ramps 202 and 206 interlock with one another, restoring the configuration shown in FIG. 3. It is in this state that loosening torque may be transmitted from the installation and removal device 101 to shaft 114.

Figure 8:
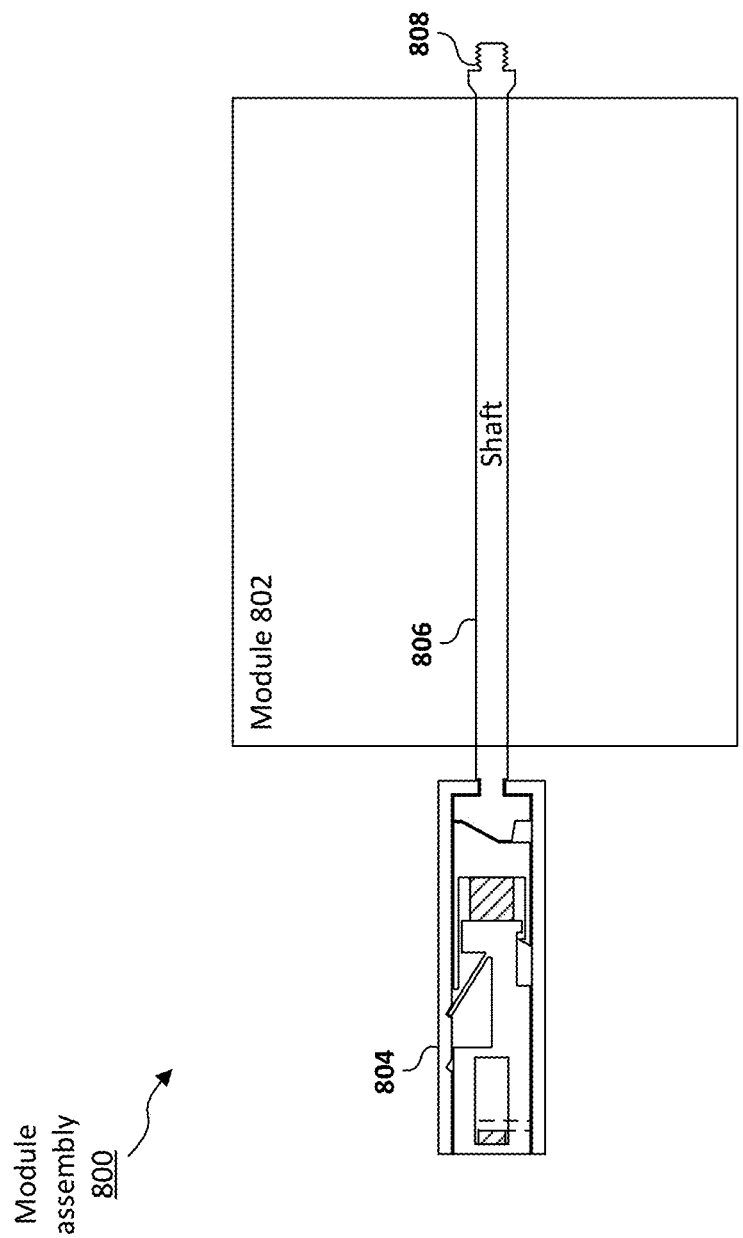
FIG. 8 illustrates a module assembly comprising a module, an installation and removal device, a shaft, and a leadscrew according to one embodiment.

FIG. 8 illustrates module assembly 800 comprising module 802, installation and removal device 804, shaft 806, and leadscrew 808, according to one embodiment. In various embodiments, module assembly 800 may be assembled with installation and removal device 804 attached to module 802. For example, and in one embodiment, installation and removal device 804 is designed and configured to stay attached to module 804 during the lifespan of module 802. In this manner, a mechanism for installing and removing module 802 into and from a host module is consistently available to users.

FIG. 9 illustrates a 3-dimensional computer-aided design of installation and removal device 901, according to some embodiments. According to the embodiment shown, the installation and removal device 101 includes housing 104, clutch activation member 112, first friction member 110, and second friction member 108. First friction member 110 is shown to include a set of annularly arranged ramps 900 that interlock with a set of complementary annularly arranged ramps 902 of second friction member 108. As noted above, first friction member 110 is rotationally fixed with housing 104. Surface 906 of first friction member 110 is shown to contact a corresponding internal surface of housing 104 and thereby rotationally fix it relative to housing 104.

In the embodiment shown, spring 208 presses against a surface of first friction member 110 to engage it with second friction member 108. For example, spring 208 is shown to be compressed by clutch activation member 112, which is held in the first position by latch 210. Latch 210 is secured in slot 214 when clutch activation member 112 is in the first position but can be dislodged from slot 214 by latch release member 212 when set of annularly arranged ramps 900 slip relative to set of annularly arranged ramps 902. When latch 210 is dislodged from slot 214, it is captured by groove 904 and secured into slot 216. Additionally, as clutch activation member 112 moves from the first position to the second position, shoulder 218 pulls against catch member 220 of first friction member 110 to fully disengage it from second friction member 108. Also shown in FIG. 9 is secondary spring 222 being compressed between stop 224 and an internal surface of the cavity region in clutch activation member 112.

Figure 10A:
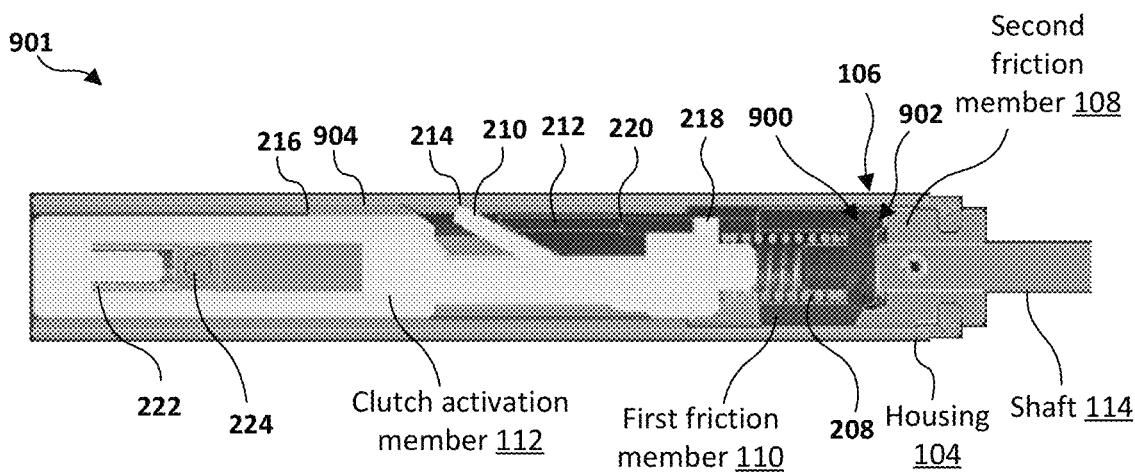
FIGS. 10A-10C show cross-sectional views of the installation and removal device shown in FIG. 9 in different stages of operation according to some embodiments.
Figure 10B:
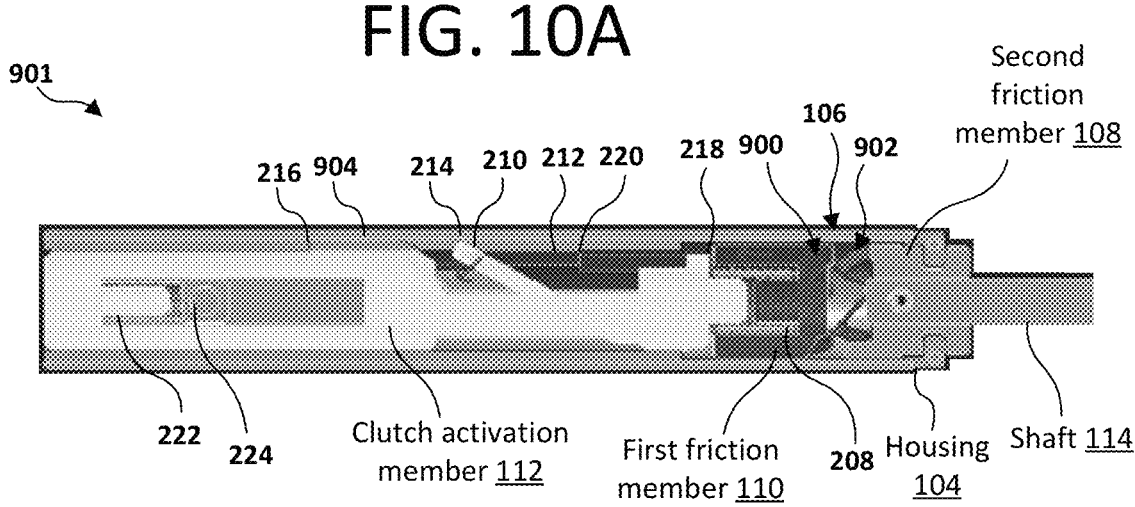
Figure 10C:
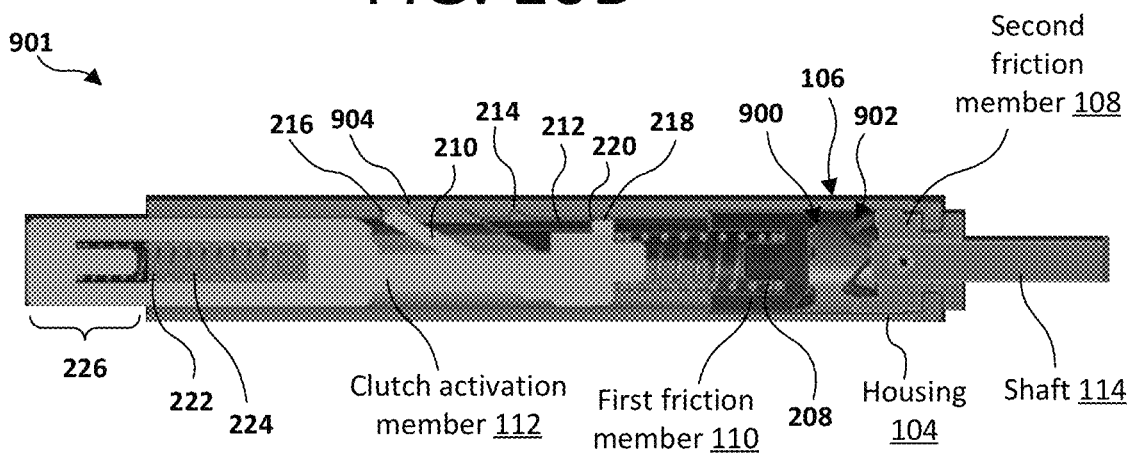

FIGS. 10A-10C show cross-sectional views of installation and removal device 901 shown in FIG. 9 in different stages of operation, according to some embodiments. In FIG. 10A, clutch activation member 112 is in the first position and secured there by latch 210. Spring 208 is shown to be compressed and exerting a pressing force against first friction member 110. This pressing force engages set of annularly arranged ramps 900 of first friction member 110 with set of annularly arranged ramps 902 of second friction member 108. In the embodiment shown, there is a concavity to the surfaces of set of annularly arranged ramps 900 and 902.

In FIG. 10B, set of annularly arranged ramps 900 have slid relative to set of annularly arranged ramps 902. As a result, a lateral displacement of first friction member 110 from second friction member 108 causes latch release member 212 to dislodge latch 210 from slot 214. At this point, spring 208 and secondary spring 222 force clutch activation member 112 from the first position to the second position.

In FIG. 10C, clutch activation member 112 is shown to be in the second position. In the second position, latch 210 is secured in slot 216. Portion 226 of clutch activation member 112 is shown to protrude from housing 104 and thereby serve as a visual indication that installation and removal device 901 has been torqued to the torque threshold. Moreover, as clutch activation member 112 moved from the first position to the second position, it also pulled first friction member 110 away from second friction member 108. For example, ledge 218 of clutch activation member 112 is operable to capture catch member 220 during movement of clutch activation member 112. In so doing, clutch assembly 106 is fully disengaged with none of set of annularly arranged ramps 900 contacting set of annularly arranged ramps 902. As a result, neither tightening torque nor loosening torque may be transmitted via clutch assembly 106. Once clutch activation member 112 is repositioned in the first position, loosening torque may be transmitted via clutch assembly 106.

Figure 11A:
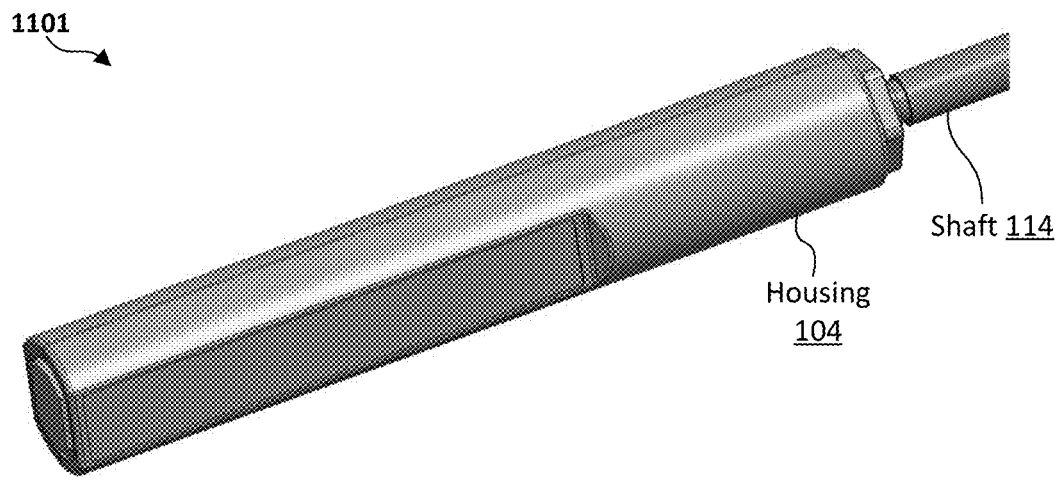
FIGS. 11A-11C show an external view of an additional example of the installation and removal device according to some embodiments.
Figure 11B:
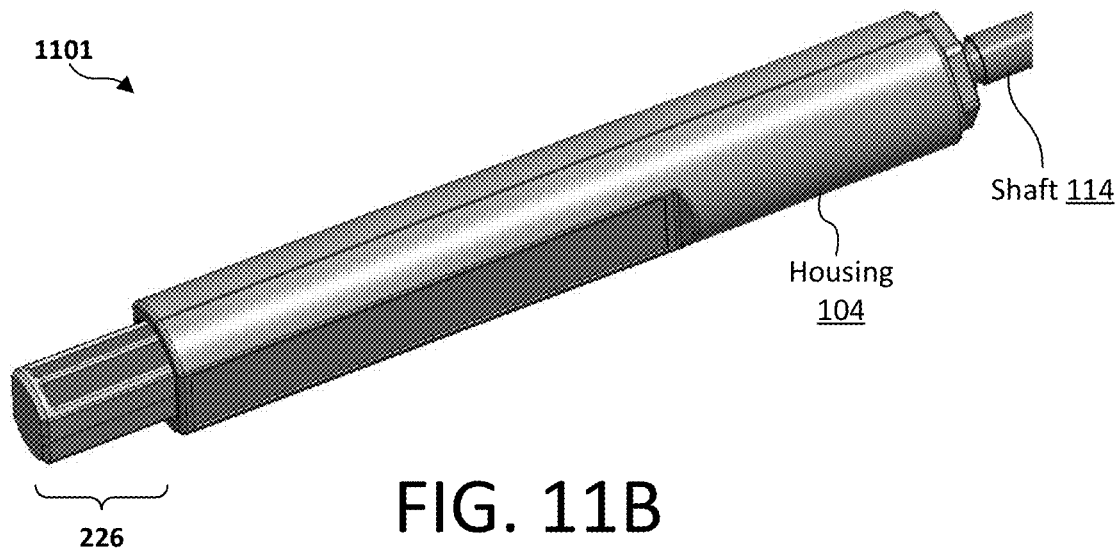
Figure 11C:
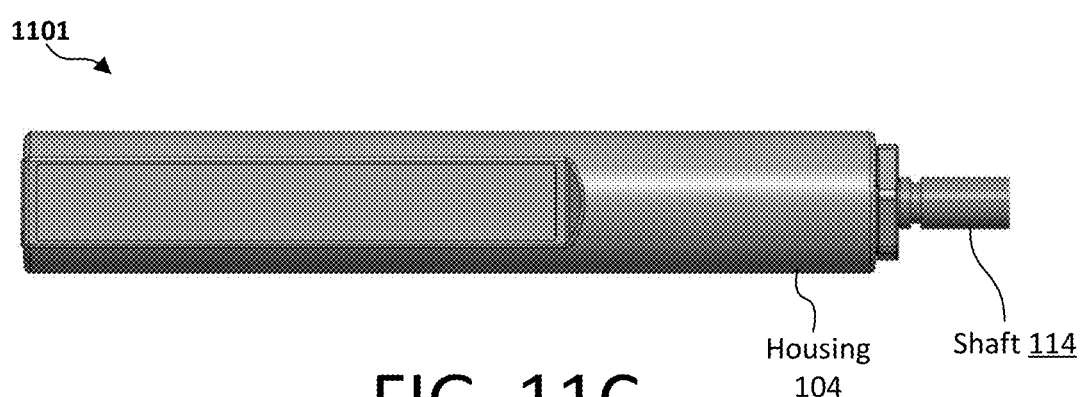

Referring to FIGS. 11A-11C, the discussion will now turn to a description an additional illustrative embodiment of the present disclosure. In some embodiments, for example, housing 104 can include opposing flat surfaces to facilitate gripping the installation and removal device 1101 during use. In some embodiments, the surfaces can be textured to increase friction while gripping the device. FIG. 11A shows the device when the torque threshold has not been reached. FIG. 11B shows that the device has reached the torque threshold. In this state, portion 226 of the clutch activation member (112, FIG. 13B) extends beyond housing 104 to provide a visual indication that the device has reached the torque threshold. FIG. 11C shows an additional external view of installation and removal device 1101.

Figure 12A:
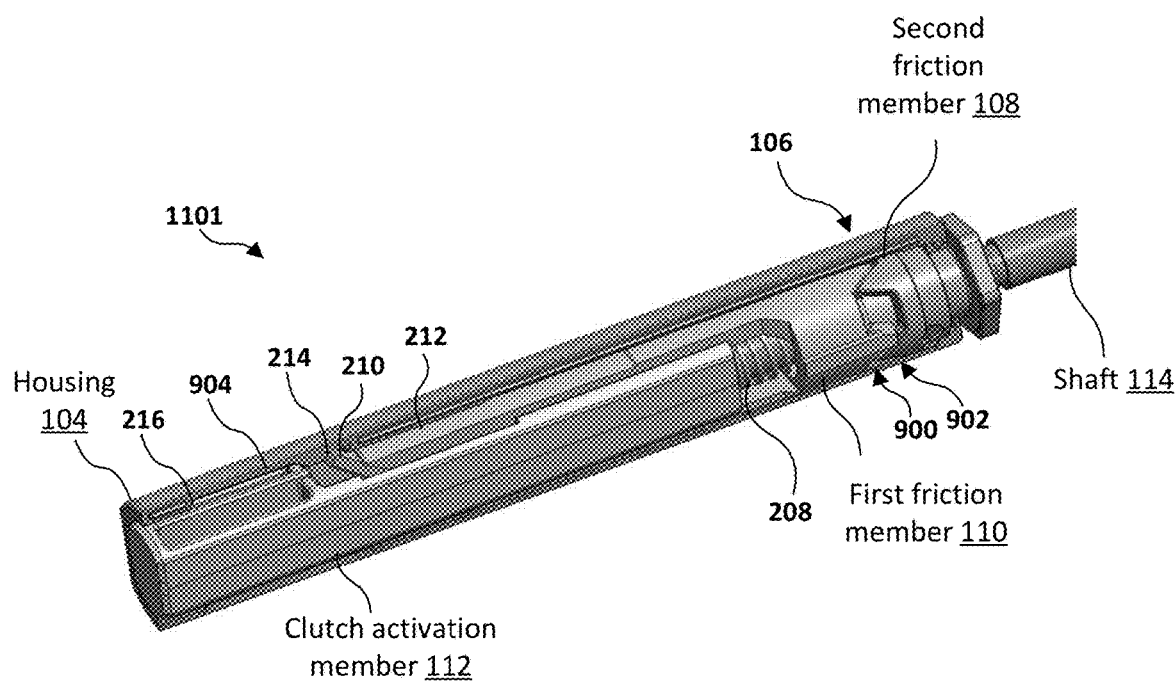
FIGS. 12A-12B show internal views of the additional example of the installation and removal device according to some embodiments.
Figure 12B:
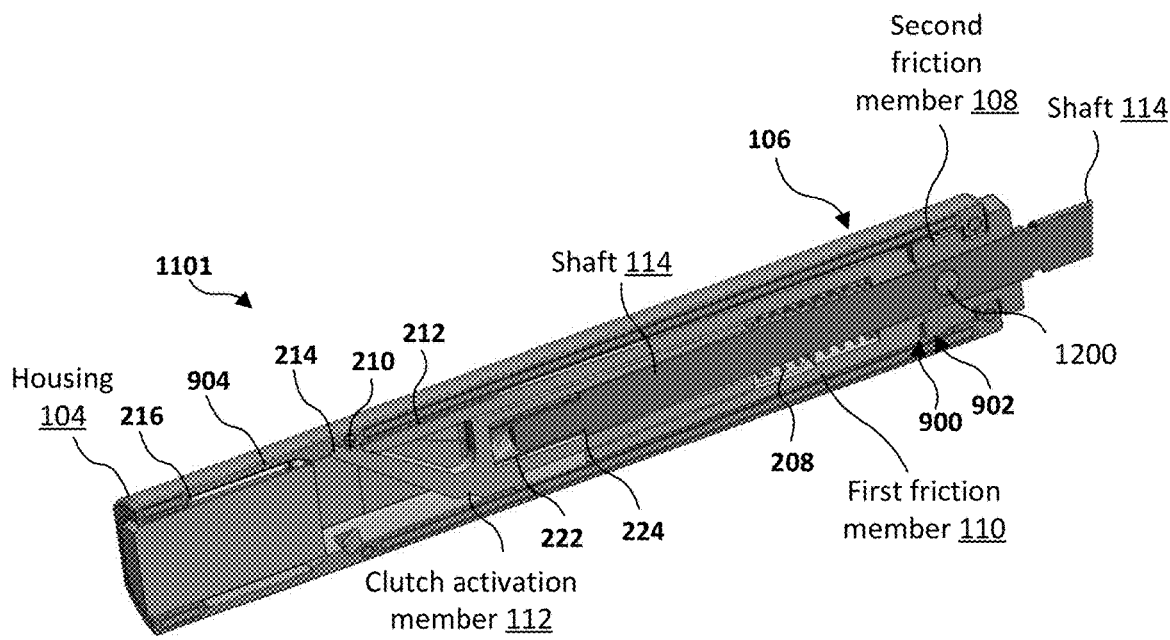

FIGS. 12A-12B show internal views of installation and removal device 1101 according to some embodiments. In FIG. 12A, clutch activation member 112 is secured in the first position by latch 210. As a result, clutch assembly 106 is in the engaged state such that annularly arranged ramps 900 of first friction member 110 and annularly arranged ramps 902 of second friction member 108 are engaged. Thus, tightening torque may be transmitted from housing 104 to shaft 114 via clutch assembly 106. Also shown in FIG. 12A are spring 208, latch release member 212, slot 214, groove 904 and slot 216.

FIG. 12B shows a cut-away view of installation and removal device 1101 of FIG. 12A. In the example shown, shaft 114 extends through a portion of installation and removal device 1101. For example, shaft 114 extends through second friction member 108 and portions of housing 104, first friction member 110, and clutch activation member 112. In these embodiments, shaft 114 provides additional rigidity to installation and removal device 1101 during its use. As shown, second friction member 108 is rotationally fixed with shaft 114 via pin 1200. Spring 208 and secondary spring 222 are approximately concentric with shaft 114. That is, longitudinal axes of spring 208 and secondary spring 222 are colinear with that of shaft 114. Additionally, in the example shown, stop 224 is formed by a portion of shaft 114 and not housing 104.

Figure 13A:
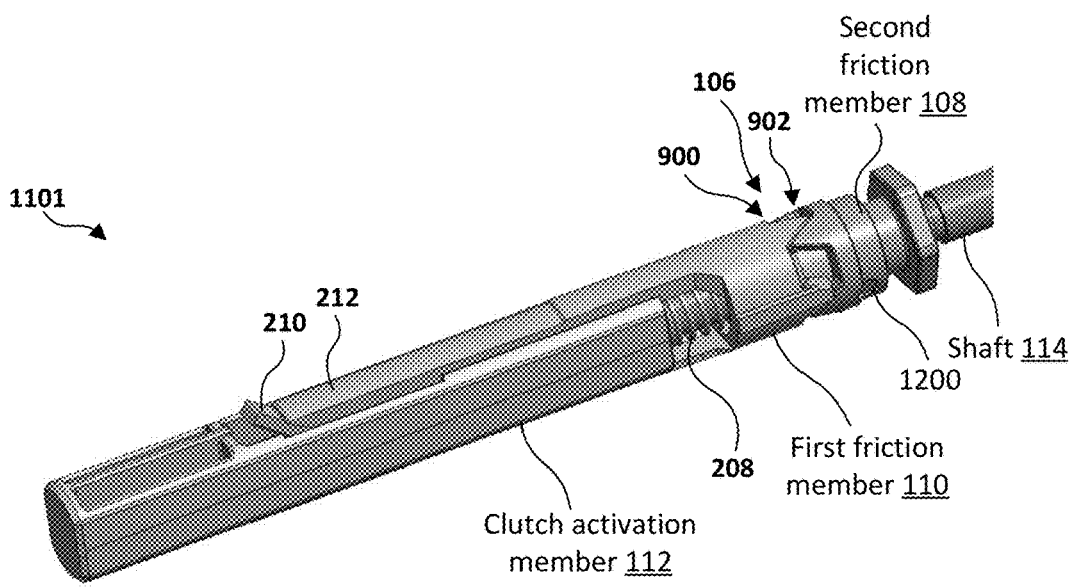
FIGS. 13A-13C show internal views of the additional example of the installation and removal device according to some embodiments.
Figure 13B:
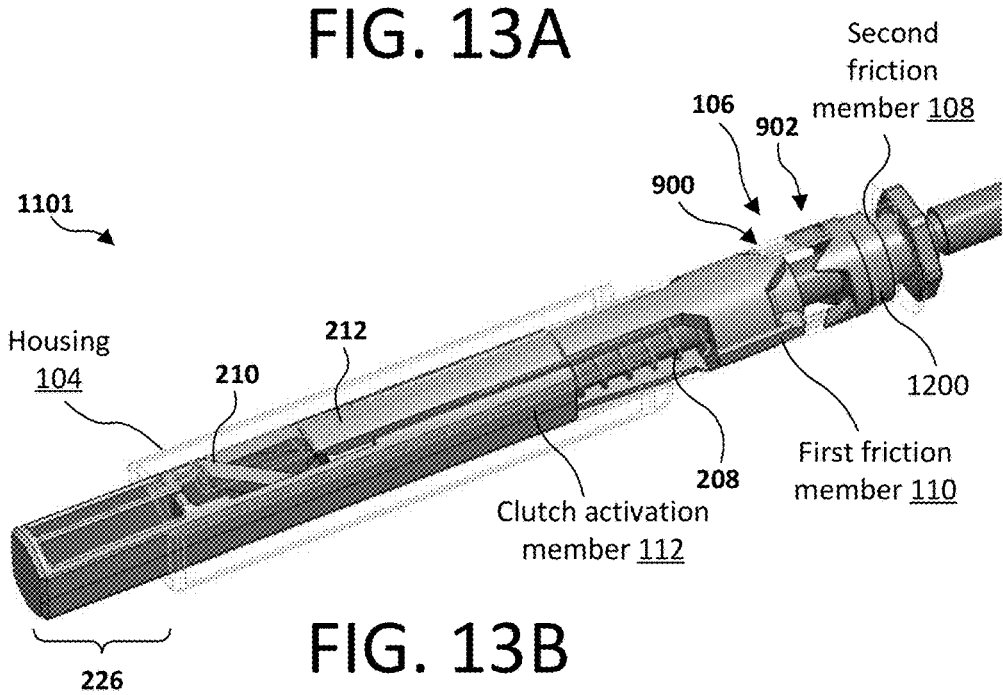
Figure 13C:
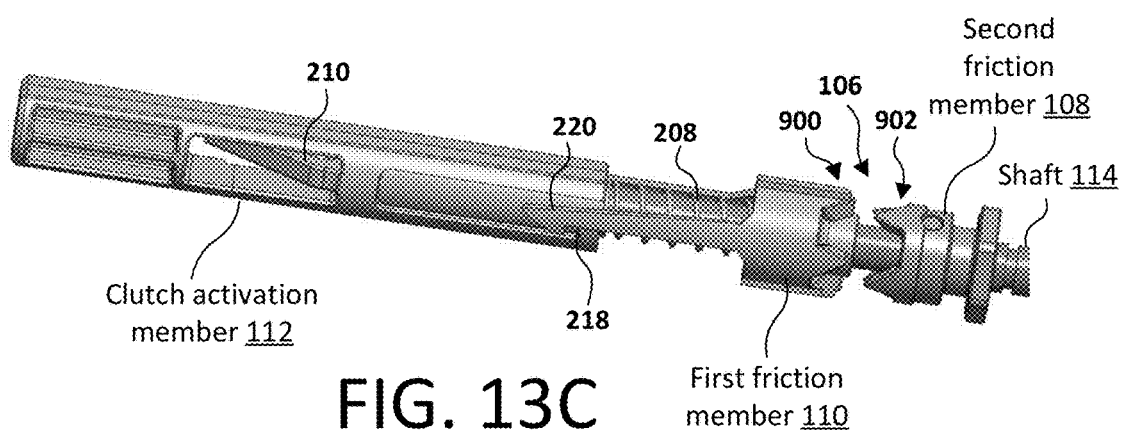

FIGS. 13A-13C show internal views of installation and removal device 1101 according to some embodiments. In FIG. 13A, clutch activation member 112 is shown in the first position, where annularly arranged ramps 900 and annularly arranged ramps 902 are engaged. In FIG. 13B, clutch activation member 112 is shown in second position, where the first friction member 110 and second friction member 108 are laterally separated so that annularly arranged ramps 900 and annularly arranged ramps 902 do not contact one another. In the second position, portion 226 of clutch activation member 112 protrudes from the housing 104. FIG. 13C shows a view of installation and removal device 1101 from a different perspective to reveal details of shoulder 218 of clutch activation member 118 and catch member 220 of first friction member 110.

Figure 14A:
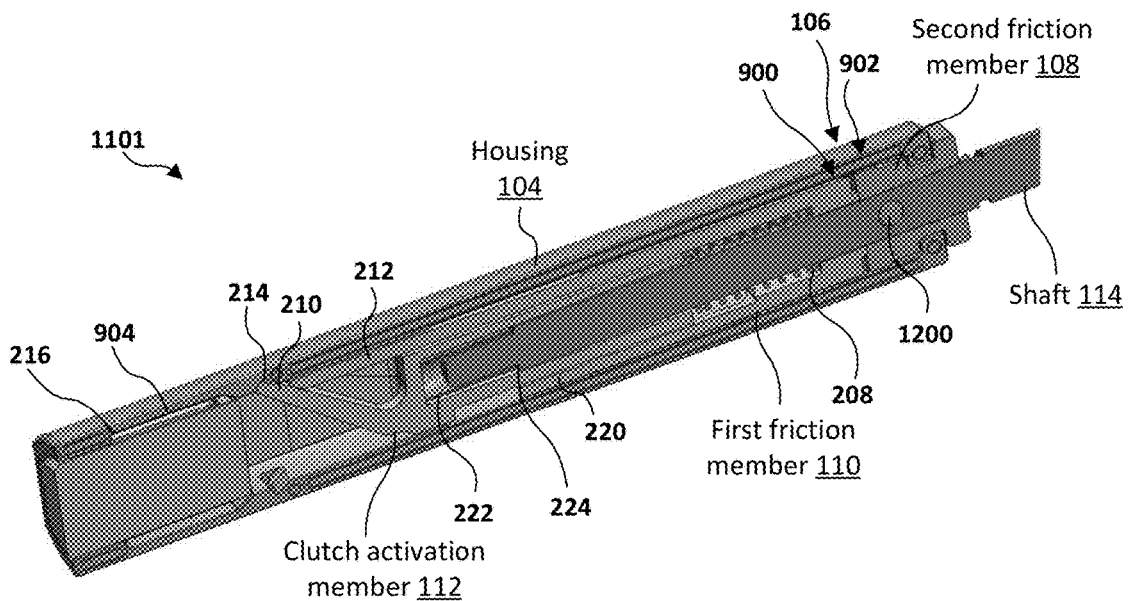
FIGS. 14A-14C show cross-sectional views of the additional example of the installation and removal device according to some embodiments.
Figure 14B:
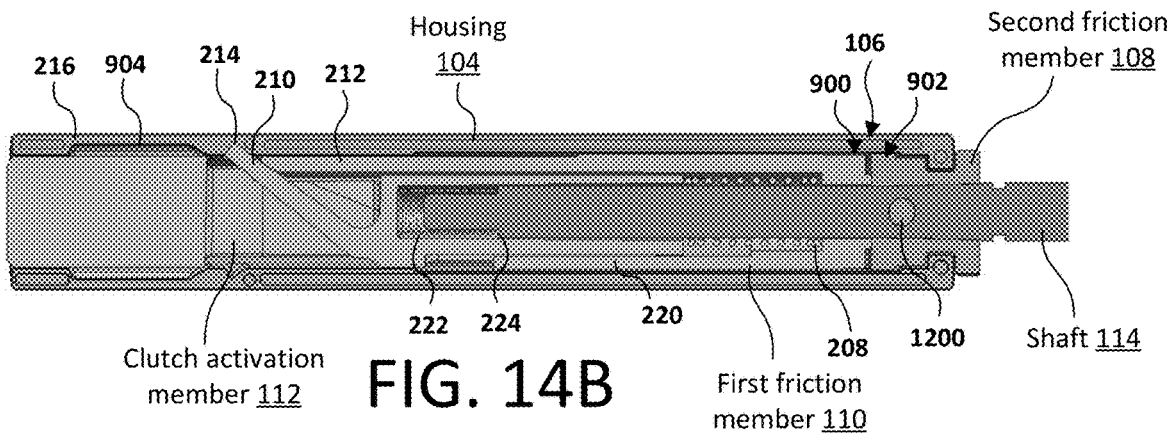
Figure 14C:
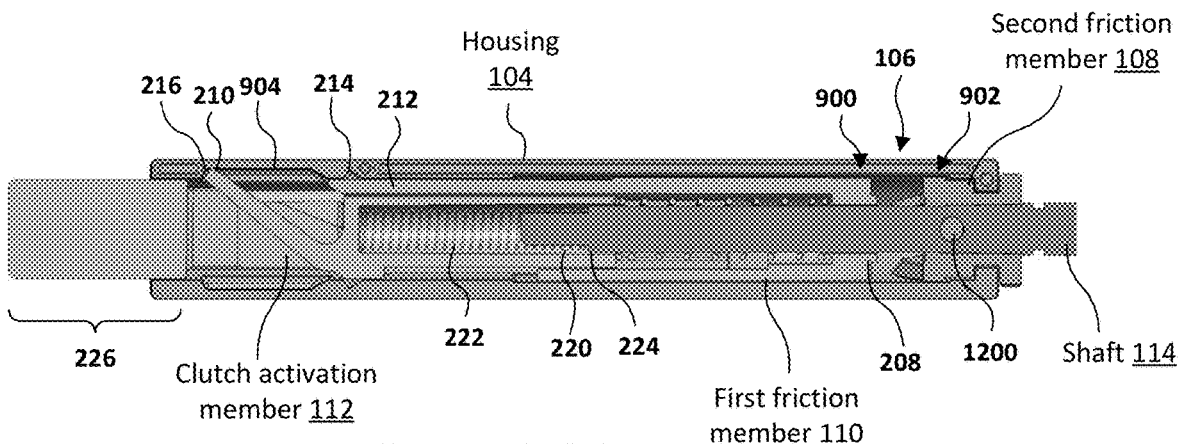

FIGS. 14A-14C show cut-away views of the installation and removal device 1101 according to some embodiments. In FIGS. 14A and 14B, clutch activation member 112 is secured in the first position by latch 210. Latch 210 is shown to be in slot 214. Spring 208 is shown to be compressed between clutch activation member 112 and a shoulder of first friction member 110. Secondary spring 222 is shown to be compressed against shoulder 224 of shaft 114 and a surface of clutch activation member 112. Both spring 208 and secondary spring 222 have longitudinal axes that are colinear with a longitudinal axis of shaft 114. In FIG. 14C, clutch activation member 112 is in the second position. Clutch activation member 112 is secured in second position by latch 210 by being lodged in slot 216. As shown, set of annularly arranged ramps 900 and set of annularly arranged ramps 902 are not in contact due to a lateral separation between first friction member 110 and second friction member 108. Moreover, as shown, portion 226 of clutch activation member 112 protrudes from housing 104. As a result, portion 226 serves as a visual indicator that (1) a torque threshold has been reached, (2) first friction member 110 and second friction member 108 are disengaged, (3) clutch activation member 112 is in second position, and (4) the annularly arranged ramps 900 and the annularly arranged ramps 902 are not longer in contact.

Further Examples

In accordance with the present disclosure, a device for tightening and loosening a securing device may comprise a housing; a shaft for engagement with the securing device; and a clutch assembly contained within the housing and connected with the shaft. The clutch assembly may comprise a clutch activation member, a first friction member operatively coupled with the clutch activation member, and a second friction member coupled to the shaft; wherein the clutch activation member is positionable in a first position and a second position; wherein when the clutch activation member is in the first position, the clutch activation member engages the first friction member with the second friction member for transmission of a torque from the first friction member to the second friction member, wherein when the clutch activation member is in the second position, the clutch activation member disengages the first friction member from the second friction member to prevent transmission of the torque from the first friction member to the second friction member, and wherein a portion of the clutch activation member protrudes from the housing when in the second position.

In some embodiments, the first friction member includes a first set of ramps arranged on a first face of the first friction member, the second friction member includes a second set of ramps arranged on a second face of the second friction member, the first set of ramps interlock with the second set of ramps to transfer torque from the first friction member to the second friction member.

In some embodiments, when the clutch activation member is in the first position and when the torque is above a threshold, the torque causes the first set of ramps to slide relative to the second set of ramps.

In some embodiments, sliding of the first set of ramps relative to the second set of ramps causes the first friction member to separate from the second friction member, wherein separation of the first friction member from the second member causes the clutch activation member to move from the first position to the second position.

In some embodiments, when the clutch activation member moves from the first position to the second position, the clutch activation member pulls the first friction member such that the first friction member is fully disengaged from the second friction member.

In some embodiments, when the first friction member is fully disengaged from the second friction member, none of the first set of ramps contact the second set of ramps.

In some embodiments, the portion of the clutch activation protruding from the housing when in the second position is configured to visually indicate that the clutch activation member has moved from the first position to the second position.

In some embodiments, when the clutch activation member is pushed from the second position to the first position, the clutch activation member engages the first friction member with the second friction member.

In some embodiments, the first friction member is rotationally fixed with the housing.

In accordance with the present disclosure, a device may include a housing; a shaft; a clutch assembly contained within the housing and connected with the shaft. The clutch assembly may include a clutch activation member, a first friction member operatively coupled with the clutch activation member, and a second friction member coupled to the shaft. The clutch assembly may be operable an engaged state, wherein the clutch activation member is in a first position and engages the first friction member with the second friction member for transmission of a torque that is below a threshold to the second friction member, a partially disengaged state, wherein a torque above the threshold causes the first friction member to laterally separate from the second friction member, and a disengaged state, wherein the clutch activation member is in a second position and disengages the first friction member from the second member to prevent transmission of torque to the second friction member.

In some embodiments, the first friction member includes a first set of ramps arranged on a first face of the first friction member, the second friction member includes a second set of ramps arranged on a second face of the second friction member, the first set of ramps interlock with the second set of ramps to transfer torque from the first friction member to the second friction member.

In some embodiments, when the clutch assembly is in the partially disengaged state, the torque above the threshold causes the first set of ramps to slide relative to the second set of ramps for said lateral separation.

In some embodiments, the first friction member causes the clutch activation member to move from the first position to the second position in response to said lateral separation.

In some embodiments, when the clutch assembly is in the disengaged state, the first friction member does not contact the second friction member.

In some embodiments, the first friction member causes the clutch activation member to move from the first position to the second position in response to said lateral separation.

In some embodiments, when the clutch assembly is in the disengaged state, a portion of the clutch activation member protrudes from the housing.

In some embodiments, the portion of the clutch activation protruding is configured to visually indicate that the clutch assembly is in the disengaged state.

In accordance with the present disclosure, an electronic module assembly configured to be installed into a host device may include an electronic module; a shaft; a leadscrew coupled to the shaft and configured for mating to a screw receiver of the host device; and an installation and removal device for tightening and loosening the leadscrew. The installation and removal device may include a housing, a clutch assembly contained within the housing and connected with the shaft, comprising a clutch activation member, a first friction member operatively coupled with the clutch activation member, and a second friction member coupled to the shaft; wherein the clutch activation member is positionable in a first position and a second position, wherein when the clutch activation member is in the first position, the clutch activation member engages the first friction member with the second friction member for transmission of a torque from the first friction member to the second friction member, wherein when the clutch activation member is in the second position, the clutch activation member disengages the first friction member from the second friction member to prevent transmission of the torque from the first friction member to the second friction member, and wherein a portion of the clutch activation member protrudes from the housing when in the second position.

In some embodiments, the first friction member includes a first set of ramps arranged on a first face of the first friction member, the second friction member includes a second set of ramps arranged on a second face of the second friction member, the first set of ramps interlock with the second set of ramps to transfer torque from the first friction member to the second friction member.

In some embodiments, when the clutch activation member is in the first position and when the torque is above a threshold, the torque causes the first set of ramps to slide relative to the second set of ramps.

In some embodiments, sliding of the first set of ramps relative to the second set of ramps causes the first friction member to separate from the second friction member, wherein separation of the first friction member from the second member causes the clutch activation member to move from the first position to the second position.

The above description illustrates various embodiments of the present disclosure along with examples of how aspects of the particular embodiments may be implemented. The above examples should not be deemed to be the only embodiments, and are presented to illustrate the flexibility and advantages of the particular embodiments as defined by the following claims. Based on the above disclosure and the following claims, other arrangements, embodiments, implementations and equivalents may be employed without departing from the scope of the present disclosure as defined by the claims.

What is claimed is:

1. A device, comprising:
   a housing;
   a shaft for engagement with a securing device; and
   a clutch assembly contained within the housing, the clutch assembly comprising:
   a clutch activation member slidably coupled to the housing and having a first position and a second position,
   a first friction member slidably coupled to the housing and operative with the clutch activation member, and
   a second friction member coupled to the shaft,
   the first friction member engaged with the second friction member for transmission of a torque from the first friction member to the second friction member when the clutch activation member is in the first position,
   the first friction member disengaged from the second friction member to prevent transmission of the torque from the first friction member to the second friction member when the clutch activation member is in the second position,
   a portion of the clutch activation member protruding from the housing to provide a visual indication of the disengagement when the clutch activation member is in the second position.

2. The device of claim 1, wherein the first friction member includes a first set of ramps, the second friction member includes a second set of ramps, the first set of ramps in contact with the second set of ramps when the clutch activation member is in the first position.

3. The device of claim 2, wherein the torque is applied to the housing and when the clutch activation member is in the first position, the torque causes the first set of ramps to slide relative to the second set of ramps.

4. The device of claim 3, wherein sliding of the first set of ramps relative to the second set of ramps causes the first friction member to separate from the second friction member, wherein separation of the first friction member from the second member causes the clutch activation member to move from the first position to the second position.

5. The device of claim 4, wherein when the clutch activation member moves from the first position to the second position, the clutch activation member pulls the first friction member such that the first friction member is disengaged from the second friction member.

6. The device of claim 1, wherein the portion of the clutch activation protruding from the housing when in the second position is configured to visually indicate that the clutch activation member has moved from the first position to the second position.

7. The device of claim 1, wherein when the clutch activation member is pushed from the second position to the first position, the clutch activation member engages the first friction member with the second friction member.

8. The device of claim 1, wherein the first friction member is rotationally fixed with the housing.

9. A device, comprising:
   a housing;
   a shaft;
   a clutch assembly contained within the housing and connected with the shaft, comprising:
   a clutch activation member,
   a first friction member operatively coupled with the clutch activation member, and a second friction member coupled to the shaft;
the clutch assembly operable in:
an engaged state, wherein the clutch activation member is in a first position and engages the first friction member with the second friction member for transmission of a torque that is below a threshold to the second friction member,
a partially disengaged state, wherein a torque above the threshold causes the first friction member to laterally separate from the second friction member, and
a disengaged state, wherein the clutch activation member is in a second position and disengages the first friction member from the second member to prevent transmission of torque to the second friction member.

10. The device of claim 9, wherein the first friction member includes a first set of ramps arranged on a first face of the first friction member, the second friction member includes a second set of ramps arranged on a second face of the second friction member, the first set of ramps interlock with the second set of ramps to transfer torque from the first friction member to the second friction member.

11. The device of claim 10, wherein when the clutch assembly is in the partially disengaged state, the torque above the threshold causes the first set of ramps to slide relative to the second set of ramps for said lateral separation.

12. The device of claim 9, wherein the first friction member causes the clutch activation member to move from the first position to the second position in response to said lateral separation.

13. The device of claim 9, wherein when the clutch assembly is in the disengaged state, the first friction member does not contact the second friction member.

14. The device of claim 9, wherein when the clutch assembly is in the disengaged state, a portion of the clutch activation member protrudes from the housing.

15. The device of claim 14, wherein the portion of the clutch activation protruding is configured to visually indicate that the clutch assembly is in the disengaged state.

16. An electronic module assembly configured to be installed into a host device, comprising:
an electronic module;
a shaft;
a leadscrew coupled to the shaft and configured for mating to a screw receiver of the host device; and
an installation and removal device for tightening and loosening the leadscrew, the installation and removal device comprising:
a housing,
a clutch assembly contained within the housing and connected with the shaft, comprising a clutch activation member, a first friction member operatively coupled with the clutch activation member, and a second friction member coupled to the shaft;
wherein the clutch activation member is positionable in a first position and a second position,
wherein when the clutch activation member is in the first position, the clutch activation member engages the first friction member with the second friction member for transmission of a torque from the first friction member to the second friction member,
wherein when the clutch activation member is in the second position, the clutch activation member disengages the first friction member from the second friction member to prevent transmission of the torque from the first friction member to the second friction member, and
wherein a portion of the clutch activation member protrudes from the housing when in the second position.

17. The electronic module assembly of claim 16, wherein the first friction member includes a first set of ramps arranged on a first face of the first friction member, the second friction member includes a second set of ramps arranged on a second face of the second friction member, the first set of ramps interlock with the second set of ramps to transfer torque from the first friction member to the second friction member.

18. The electronic module assembly of claim 17, wherein when the clutch activation member is in the first position and when the torque is above a threshold, the torque causes the first set of ramps to slide relative to the second set of ramps.

19. The electronic module assembly of claim 18, wherein sliding of the first set of ramps relative to the second set of ramps causes the first friction member to separate from the second friction member, wherein separation of the first friction member from the second member causes the clutch activation member to move from the first position to the second position.

* * * * *